US012653076B2

(12) United States Patent
Uejima et al.

(10) Patent No.: US 12,653,076 B2
(45) Date of Patent: Jun. 9, 2026

(54) RADIO FREQUENCY MODULE AND COMMUNICATION DEVICE

(71) Applicant: Murata Manufacturing Co., Ltd., Nagaokakyo (JP)

(72) Inventors: Takanori Uejima, Nagaokakyo (JP); Hiromichi Kitajima, Nagaokakyo (JP); Kiyoshi Aikawa, Nagaokakyo (JP); Yoshihiro Daimon, Nagaokakyo (JP); Takashi Yamada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 296 days.

(21) Appl. No.: 18/477,747

(22) Filed: Sep. 29, 2023

(65) Prior Publication Data

US 2024/0030201 A1      Jan. 25, 2024

Related U.S. Application Data

(63) Continuation of application No. PCT/JP2022/010795, filed on Mar. 11, 2022.

(30) Foreign Application Priority Data

Mar. 31, 2021      (JP) ................................. 2021-060289

(51) Int. Cl.
H10W 90/00 (2026.01)
H04B 1/38 (2015.01)

(52) U.S. Cl.
CPC .............. H10W 90/00 (2026.01); H04B 1/38 (2013.01)

(58) Field of Classification Search
CPC ...... H04B 1/38; H04B 1/3827; H04B 1/3833; H04B 1/40; H04B 1/44; H04B 1/006;
(Continued)

(56) References Cited

U.S. PATENT DOCUMENTS 10,515,924 B2 * 12/2019 Babcock .................. H04B 1/40
10,778,174 B2 * 9/2020 Ta ............................. H03F 3/19
(Continued)

FOREIGN PATENT DOCUMENTS

CN          101009970 A      8/2007
JP          2013-102356 A      5/2013
(Continued)

OTHER PUBLICATIONS

International Search Report and Written Opinion mailed on Jun. 21, 2022, received for PCT Application PCT/JP2022/010795, filed on Mar. 11, 2022, 8 pages including English Translation.

*Primary Examiner* — Quochien B Vuong
(74) *Attorney, Agent, or Firm* — XSENSUS LLP

(57) ABSTRACT

A radio frequency module includes a first module substrate that has a first main surface facing a second main surface, a second module substrate that has a third main surface facing a fourth main surface, the third main surface facing the second main surface, multiple electronic components that are disposed between the second main surface and the third main surface, on or along the first main surface, and on or along the fourth main surface, and a LC component that is disposed in the module substrate and that is an inductor or a capacitor. A relative dielectric constant of the module substrate is higher than a relative dielectric constant of the module substrate.

15 Claims, 4 Drawing Sheets

(58) Field of Classification Search
CPC ........ H04M 1/00; H04M 1/02; H04M 1/0202;
H04M 1/0206; H04M 1/0208; H04M
1/021; H04M 1/0212; H04M 1/0214;
H04M 1/0216; H04M 1/0222; H03F 3/24;
H03F 3/195
See application file for complete search history.

(56)                    References Cited

U.S. PATENT DOCUMENTS

| | | | |
|---|---|---|---|
| 12,021,065 B2 * | 6/2024 | Siomkos ................. | H01L 23/28 |
| 2021/0050876 A1 * | 2/2021 | Matsumoto .............. | H04B 1/40 |
| 2021/0219419 A1 * | 7/2021 | Takematsu ............... | H04B 1/44 |

FOREIGN PATENT DOCUMENTS

| | | | |
|---|---|---|---|
| JP | 2019-097026 A | 6/2019 | |
| WO | 2017/033564 A1 | 3/2017 | |
| WO | 2020/022180 A1 | 1/2020 | |
| WO | 2020/090230 A1 | 5/2020 | |

* cited by examiner

RADIO FREQUENCY MODULE AND COMMUNICATION DEVICE

CROSS-REFERENCE TO RELATED APPLICATIONS

This application is a continuation of international application no. PCT/JP2022/010795, filed Mar. 11, 2022, and which claims priority to Japanese application no. 2021-060289, filed Mar. 31, 2021. The entire contents of both prior applications are hereby incorporated by reference.

TECHNICAL FIELD

The present disclosure relates to a radio frequency module and a communication device.

BACKGROUND ART

As for mobile communication devices such as cellular phones, radio frequency front end modules are increasingly complicated particularly due to development in support of a multi-band. Patent Document 1 discloses a technique for decreasing the size of a radio frequency module by using two module substrates.

CITATION LIST

Patent Document

Patent Document 1: International Publication No. 2020/022180

SUMMARY

Technical Problems

As for the technique described above, however, it is difficult to decrease the size while good transmission characteristics are maintained.

In view of this, the present disclosure provides a radio frequency module and a communication device that have a decreased size and maintain good transmission characteristics.

Solutions to Problems

A radio frequency module according to an aspect of the present disclosure includes a first module substrate that has a first main surface facing a second main surface, a second module substrate that has a third main surface facing a fourth main surface, the third main surface facing the second main surface, multiple electronic components that are disposed between the second main surface and the third main surface, on or along the first main surface, and on or along the fourth main surface, and a LC component that is disposed in the first module substrate and that is an inductor or a capacitor. A relative dielectric constant of the first module substrate is higher than a relative dielectric constant of the second module substrate.

A radio frequency module according to an aspect of the present disclosure includes a first module substrate that has a first main surface facing a second main surface, a second module substrate that has a third main surface facing a fourth main surface, the third main surface facing the second main surface, multiple electronic components that are disposed between the second main surface and the third main surface, on or along the first main surface, and on or along the fourth main surface, and a LC component that is disposed in the first module substrate and that is an inductor or a capacitor. The second module substrate is a printed circuit board. The first module substrate is a low-temperature co-fired ceramic substrate or a high-temperature co-fired ceramic substrate.

Advantageous Effects

A radio frequency module according to an aspect of the present disclosure can have a decreased size and maintain good transmission characteristics.

DETAILED DESCRIPTION

Figure 1:
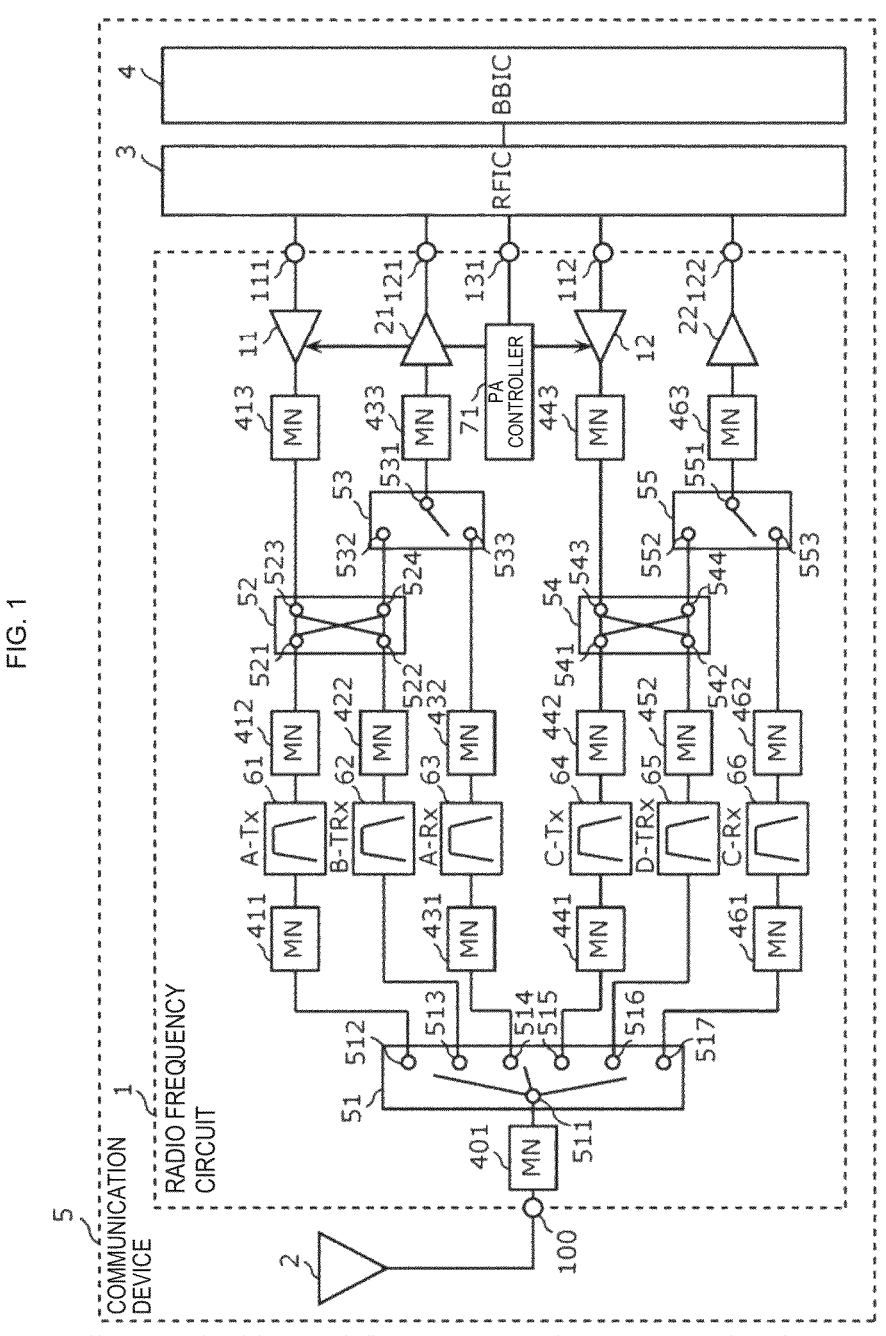
FIG. 1 is a circuit diagram of a radio frequency circuit and a communication device according to an exemplary embodiment.

An exemplary embodiment of the present disclosure will hereinafter be described in detail with reference to the drawings. The embodiment is comprehensively or specifically described below. In the following embodiment, numerical values, shapes, materials, components, and the arrangement and connection form of the components, for example, are described by way of example and do not limit the present disclosure.

The drawings are schematically illustrated to describe the present disclosure so as to appropriately include emphasis, omission, adjustment in a ratio and are not necessarily strictly illustrated, and some shapes, positional relationships, and ratios differ from actual ones. In the drawings, substantially like components are designated by using like reference signs, and a duplicated description is omitted or simplified in some cases.

In the drawings described below, an x-axis and a y-axis are perpendicular to each other along a plane parallel with a main surface of a module substrate. Specifically, in the case where the module substrate has a rectangular shape in a plan view, the x-axis is parallel with a first side of the module substrate, and the y-axis is parallel with a second side of the module substrate perpendicular to the first side. A z-axis is perpendicular to the main surface of the module substrate, a positive direction thereof represents an upward direction, and a negative direction thereof represents a downward direction.

As for a circuit structure according to the present disclosure, the case of "being connected" includes not only the case of being directly connected by using a connection terminal and/or a wiring conductor but also the case of being electrically connected with another circuit element interposed therebetween. The expression "connected between A and B" means being connected to both of A and B between A and B, and the meaning thereof includes not only being connected in series on a path that connects A and B to each other but also being connected in parallel between the path and the ground (shunt connection).

As for the arrangement of components according to the present disclosure, a "plan view" means that an object orthographically projected on an xy plane is viewed from a positive position on the z-axis. The expression "A overlaps B in a plan view" means that the region of A orthographically projected on the xy plane overlaps the region of B orthographically projected on the xy plane. The expression "A is disposed between B and C" means that at least one of multiple lines that connect a freely selected point in B and a freely selected point in C to each other passes through A. The expression "A is joined to B" means that A is physically connected to B. Terms that represent relationships between elements such as "parallel" and "perpendicular", and a term that represents the shape of an element such as "rectangular", and a numeral range do not have only strict meanings but have substantially the same meanings including, for example, an error of about several percent.

As for the arrangement of the components according to the present disclosure, the expression "a component is disposed in, on, or along a substrate" means that the component is disposed on or along a main surface of the substrate or that the component is disposed in the substrate. The expression "a component is disposed on or along a main surface of a substrate" means that the component is in contact with the main surface of the substrate or that the component is not in contact with the main surface but is disposed along the main surface (for example, the component is stacked on another component that is in contact with the main surface). The expression "a component is disposed on or along a main surface of a substrate" may mean that the component is disposed in a recessed portion that is formed on the main surface. The expression "a component is disposed in a substrate" means that the component is encapsulated in a module substrate or that the entire component is disposed between both main surfaces of the substrate but a part of the component is not covered by the substrate. The expression "a component is disposed between two main surfaces" means that the component is disposed so as to be in contact with both of the two main surfaces, that the component is disposed so as to be in contact with one of the two main surfaces, or that the component is disposed so as not to be in contact with the two main surfaces.

Embodiment

[1 Circuit Structures of Radio Frequency Circuit 1 and Communication Device 5]

The circuit structures of a radio frequency circuit 1 and a communication device 5 according to the exemplary embodiment will be described with reference to FIG. 1. FIG. 1 is a circuit diagram of the radio frequency circuit 1 and the communication device 5 according to the exemplary embodiment.

[1.1 Circuit Structure of Communication Device 5]

The circuit structure of the communication device 5 will now be described. As illustrated in FIG. 1, the communication device 5 according to the exemplary embodiment includes the radio frequency circuit 1, an antenna 2, a RFIC (Radio Frequency Integrated Circuit) 3, and a BBIC (Baseband Integrated Circuit) 4.

The radio frequency circuit 1 transmits a radio frequency signal between the antenna 2 and the RFIC 3. An inner structure of the radio frequency circuit 1 will be described later.

The antenna 2 is connected to an antenna connection terminal 100 in the radio frequency circuit 1, transmits a radio frequency signal that is outputted from the radio frequency circuit 1, and outputs a radio frequency signal that is received from the outside to the radio frequency circuit 1.

The RFIC 3 is an example of a signal processing circuit that processes a radio frequency signal. Specifically, the RFIC 3 processes a radio frequency reception signal that is inputted via a reception path in the radio frequency circuit 1 by using, for example, down-converting and outputs a reception signal that is thus processed and generated to the BBIC 4. The RFIC 3 processes a transmission signal that is inputted from the BBIC 4 by using, for example, up-converting and outputs a radio frequency transmission signal that is thus processed and generated to a transmission path in the radio frequency circuit 1. The RFIC 3 includes a controller that controls, for example, switches and amplifiers that are included in the radio frequency circuit 1. A part or the whole of the function of the controller of the RFIC 3 may be performed outside the RFIC 3 and may be performed by, for example, the BBIC 4 or the radio frequency circuit 1.

The BBIC 4 is a baseband signal processing circuit that processes a signal by using an intermediate frequency band lower than that of a radio frequency signal that is transmitted by the radio frequency circuit 1. Examples of the signal that is processed by the BBIC 4 include an image signal for image display and/or an audio signal for telecommunication via a speaker.

As for the communication device 5 according to the exemplary embodiment, the antenna 2 and the BBIC 4 are not essential components.

[1.2 Circuit Structure of Radio Frequency Circuit 1]

The circuit structure of the radio frequency circuit 1 will now be described. As illustrated in FIG. 1, the radio frequency circuit 1 includes power amplifiers (PA) 11 and 12, low-noise amplifiers (LNA) 21 and 22, matching circuits (MN) 401, 411 to 413, 422, 431 to 433, 441 to 443, 452, and 461 to 463, switches (SW) 51 to 55, filters 61 to 66, a PA controller (PAC) 71, the antenna connection terminal 100, radio frequency input terminals 111 and 112, radio frequency output terminals 121 and 122, and a control terminal 131. The components of the radio frequency circuit 1 will now be sequentially described.

The antenna connection terminal 100 is connected to the antenna 2 outside the radio frequency circuit 1.

The radio frequency input terminals 111 and 112 receive a radio frequency transmission signal from a location outside the radio frequency circuit 1. According to the exemplary embodiment, the radio frequency input terminals 111 and 112 are connected to the RFIC 3 outside the radio frequency circuit 1.

The radio frequency output terminals 121 and 122 provide a radio frequency reception signal to a location outside the radio frequency circuit 1. According to the exemplary embodiment, the radio frequency output terminals 121 and 122 are connected to the RFIC 3 outside the radio frequency circuit 1.

The control terminal 131 transmits a control signal. That is, the control terminal 131 receives a control signal from a location outside the radio frequency circuit 1 and/or provides a control signal to a location outside the radio frequency circuit 1. A control signal is a signal regarding control of an electronic circuit that is included in the radio frequency circuit 1. Specifically, an example of the control signal is a digital signal for controlling at least one selected from the power amplifiers 11 and 12, the low-noise amplifiers 21 and 22, and the switches 51 to 55.

The power amplifier 11 is connected between the radio frequency input terminal 111 and the filter 61 and between the radio frequency input terminal 111 and the filter 62 and can amplify transmission signals in bands A and B. Specifically, an input end of the power amplifier 11 is connected to the radio frequency input terminal 111. An output end of the power amplifier 11 is connected to the filter 61 with the matching circuit 413, the switch 52, and the matching circuit 412 interposed therebetween. The output end of the power amplifier 11 is connected to the filter 62 with the matching circuit 413, the switch 52, and the matching circuit 422 interposed therebetween.

The power amplifier 12 is connected between the radio frequency input terminal 112 and the filter 64 and between the radio frequency input terminal 112 and the filter 65 and can amplify transmission signals in bands C and D. Specifically, an input end of the power amplifier 12 is connected to the radio frequency input terminal 112. An output end of the power amplifier 12 is connected to the filter 64 with the matching circuit 443, the switch 54, and the matching circuit 442 interposed therebetween. The output end of the power amplifier 12 is connected to the filter 65 with the matching circuit 443, the switch 54, and the matching circuit 452 interposed therebetween.

The power amplifiers 11 and 12 are electronic components that acquire an output signal that has energy higher than that of an input signal (a transmission signal), based on power that is supplied from a power source. The power amplifiers 11 and 12 include respective amplifier transistors and may further include respective inductors and/or capacitors. Inner structures of the power amplifiers 11 and 12 are not particularly limited. For example, the power amplifiers 11 and 12 may be multistage amplifiers, differential amplifiers, or Doherty amplifiers.

The low-noise amplifier 21 is connected between the filter 62 and the radio frequency output terminal 121 and between the filter 63 and the radio frequency output terminal 121 and can amplify reception signals in the bands A and B. Specifically, an input end of the low-noise amplifier 21 is connected to the filter 62 with the matching circuit 433, the switches 53 and 52, and the matching circuit 422 interposed therebetween. The input end of the low-noise amplifier 21 is connected to the filter 63 with the matching circuit 433, the switch 53, and the matching circuit 432 interposed therebetween. An output end of the low-noise amplifier 21 is connected to the radio frequency output terminal 121.

The low-noise amplifier 22 is connected between the filter 65 and the radio frequency output terminal 122 and between the filter 66 and the radio frequency output terminal 122 and can amplify reception signals in the bands C and D. Specifically, an input end of the low-noise amplifier 22 is connected to the filter 65 with the matching circuit 463, the switches 55 and 54, and the matching circuit 452 interposed therebetween. The input end of the low-noise amplifier 22 is connected to the filter 66 with the matching circuit 463, the switch 55, and the matching circuit 462 interposed therebetween. An output end of the low-noise amplifier 22 is connected to the radio frequency output terminal 122.

The low-noise amplifiers 21 and 22 are electronic components that acquire an output signal that has energy higher than that of an input signal (a reception signal), based on power that is supplied from a power source. The low-noise amplifiers 21 and 22 include respective amplifier transistors and may further include respective inductors and/or capacitors. Inner structures of the low-noise amplifiers 21 and 22 are not particularly limited.

The matching circuits 401, 411 to 413, 422, 431 to 433, 441 to 443, 452, and 461 to 463 are connected between two circuit elements and can match impedance between the two circuit elements. That is, the matching circuits 401, 411 to 413, 422, 431 to 433, 441 to 443, 452, and 461 to 463 are impedance matching circuits. The matching circuits 401, 411 to 413, 422, 431 to 433, 441 to 443, 452, and 461 to 463 include at least respective inductors or capacitors.

The matching circuit 411 is connected between the switch 51 and the filter 61. The matching circuit 431 is connected between the switch 51 and the filter 63. The matching circuit 441 is connected between the switch 51 and the filter 64. The matching circuit 461 is connected between the switch 51 and the filter 66.

The matching circuit 412 is connected between the power amplifier 11 and the filter 61. The matching circuit 413 is connected between the power amplifier 11 and the filter 61 and between the power amplifier 11 and the filter 62. The matching circuit 442 is connected between the power amplifier 12 and the filter 64. The matching circuit 443 is connected between the power amplifier 12 and the filter 64 and between the power amplifier 12 and the filter 65.

The matching circuit 401 is connected between the antenna connection terminal 100 and the switch 51.

The matching circuit 432 is an example of a first inductor and is connected between the low-noise amplifier 21 and the filter 63. The matching circuit 433 is an example of the first inductor and is connected between the low-noise amplifier 21 and the filter 63. The matching circuit 462 is an example of the first inductor and is connected between the low-noise amplifier 22 and the filter 66. The matching circuit 463 is an example of the first inductor and is connected between the low-noise amplifier 22 and the filter 66.

The switch 51 is an example of a first switch and is connected between the antenna connection terminal 100 and the filters 61 to 66. The switch 51 includes terminals 511 to 517. The terminal 511 is connected to the antenna connection terminal 100. The terminal 512 is connected to the filter 61 with the matching circuit 411 interposed therebetween. The terminal 513 is connected to the filter 62. The terminal 514 is connected to the filter 63 with the matching circuit 431 interposed therebetween. The terminal 515 is connected to the filter 64 with the matching circuit 441 interposed therebetween. The terminal 516 is connected to the filter 65. The terminal 517 is connected to the filter 66 with the matching circuit 461 interposed therebetween.

With this structure for connection, the switch 51 can connect the terminal 511 to at least one of the terminals 512 to 517, for example, based on a control signal from the RFIC 3. That is, the switch 51 can switch connection and disconnection between the antenna connection terminal 100 and the filters 61 to 66. For example, the switch 51 includes a multiconnection switch circuit and is referred to as an antenna switch in some cases.

The switch 52 is connected between the output end of the power amplifier 11 and the filter 61 and between the output end of the power amplifier 11 and the filter 62 and is connected between the input end of the low-noise amplifier 21 and the filter 62. The switch 52 includes terminals 521 to 524. The terminal 521 is connected to the filter 61 with the matching circuit 412 interposed therebetween. The terminal 522 is connected to the filter 62 with the matching circuit 422 interposed therebetween. The terminal 523 is connected to the output end of the power amplifier 11 with the matching circuit 413 interposed therebetween. The terminal 524 is connected to the input end of the low-noise amplifier 21 with the switch 53 and the matching circuit 433 interposed therebetween.

With this structure for connection, the switch 52 can connect the terminal 523 to at least the terminal 521 or 522, for example, based on a control signal from the RFIC 3 and can connect the terminal 522 to the terminal 523 or 524. That is, the switch 52 can switch connection and disconnection between the power amplifier 11 and the filter 61 and between the power amplifier 11 and the filter 62 and can change the connection destination of the filter 62 between the power amplifier 11 and the low-noise amplifier 21. For example, the switch 52 includes a multiconnection switch circuit.

The switch 53 is connected between the input end of the low-noise amplifier 21 and the filter 62 and between the input end of the low-noise amplifier 21 and the filter 63. The switch 53 includes terminals 531 to 533. The terminal 531 is connected to the input end of the low-noise amplifier 21 with the matching circuit 433 interposed therebetween. The terminal 532 is connected to the terminal 524 of the switch 52 and is connected to the filter 62 with the switch 52 and the matching circuit 422 interposed therebetween. The terminal 533 is connected to the filter 63 with the matching circuit 432 interposed therebetween.

With this structure for connection, the switch 53 can connect the terminal 531 to at least the terminal 532 or 533, for example, based on a control signal from the RFIC 3. That is, the switch 53 can switch connection and disconnection between the low-noise amplifier 21 and the filter 62 and between the low-noise amplifier 21 and the filter 63. For example, the switch 53 includes a multiconnection switch circuit.

The switch 54 is connected between the output end of the power amplifier 12 and the filter 64 and between the output end of the power amplifier 12 and the filter 65 and is connected between the input end of the low-noise amplifier 22 and the filter 65. The switch 54 includes terminals 541 to 544. The terminal 541 is connected to the filter 64 with the matching circuit 442 interposed therebetween. The terminal 542 is connected to the filter with the matching circuit 452 interposed therebetween. The terminal 543 is connected to the output end of the power amplifier 12 with the matching circuit 443 interposed therebetween. The terminal 544 is connected to the input end of the low-noise amplifier 22 with the switch 55 and the matching circuit 463 interposed therebetween.

With this structure for connection, the switch 54 can connect the terminal 543 to at least the terminal 541 or 542, for example, based on a control signal from the RFIC 3 and can connect the terminal 542 to the terminal 543 or 544. That is, the switch 54 can switch connection and disconnection between the power amplifier 12 and the filter 64 and between the power amplifier 12 and the filter 65 and can change the connection destination of the filter 65 between the power amplifier 12 and the low-noise amplifier 22. For example, the switch 54 includes a multiconnection switch circuit.

The switch 55 is connected between the input end of the low-noise amplifier 22 and the filter 65 and between the input end of the low-noise amplifier 22 and the filter 66. The switch 55 includes terminals 551 to 553. The terminal 551 is connected to the input end of the low-noise amplifier 22 with the matching circuit 463 interposed therebetween. The terminal 552 is connected to the terminal 544 of the switch 54 and is connected to the filter 65 with the switch 54 and the matching circuit 452 interposed therebetween. The terminal 553 is connected to the filter 66 with the matching circuit 462 interposed therebetween.

With this structure for connection, the switch 55 can connect the terminal 551 to at least the terminal 552 or 553, for example, based on a control signal from the RFIC 3. That is, the switch 55 can switch connection and disconnection between the low-noise amplifier 22 and the filter 65 and between the low-noise amplifier 22 and the filter 66. For example, the switch 55 includes a multiconnection switch circuit.

The filter 61 (A-Tx) is connected between the power amplifier 11 and the antenna connection terminal 100. Specifically, an end of the filter 61 is connected to the antenna connection terminal 100 with the matching circuit 411, the switch 51, and the matching circuit 401 interposed therebetween. Another end of the filter 61 is connected to the output end of the power amplifier 11 with the matching circuit 412, the switch 52, and the matching circuit 413 interposed therebetween. The filter 61 has a pass band that includes an uplink operation band in the band A for frequency division duplex (FDD) and enables a transmission signal in the band A to pass.

The filter 62 (B-TRx) is an example of a first filter and an example of a second filter, is connected between the antenna connection terminal 100 and the power amplifier 11, and is connected between the antenna connection terminal 100 and the low-noise amplifier 21. Specifically, an end of the filter 62 is connected to the antenna connection terminal 100 with the switch 51 and the matching circuit 401 interposed therebetween. Another end of the filter 62 is connected to the output end of the power amplifier 11 with the matching circuit 422, the switch 52, and the matching circuit 413 interposed therebetween and is connected to the input end of the low-noise amplifier 21 with the matching circuit 422, the switches 52 and 53, and the matching circuit 433 interposed therebetween. The filter 62 has a pass band that includes the band B for time division duplex (TDD) and enables a transmission signal and a reception signal in the band B to pass.

Figure 2:
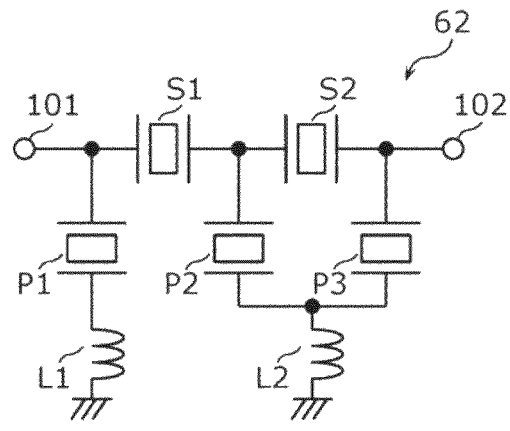
FIG. 2 illustrates an example of a circuit structure of a first filter according to the exemplary embodiment.

FIG. 2 illustrates an example of the circuit structure of the filter 62 according to the embodiment. As illustrated, the filter 62 includes series arm resonators S1 and S2 that are disposed on a path that connects input and output terminals 101 and 102, parallel arm resonators P1, P2, and P3 that are connected between the path and the ground, and inductors L1 and L2.

Examples of the series arm resonators S1 to S2 and the parallel arm resonators P1 to P3 are elastic resonators. In this case, the filter 62 serves as a ladder acoustic wave filter.

The inductor L1 is connected between the parallel arm resonator P1 and the ground. The inductor L2 is connected between the parallel arm resonator P2 and the ground and between the parallel arm resonator P3 and the ground. The arrangement of the inductors L1 and L2 enables the pass band of the filter 62 to be expanded and enables attenuation characteristics to be improved. The inductors L1 and L2 may be capacitors or may be composite elements of an inductor and a capacitor.

As for the filter 62, the structure of connection between the series arm resonators and the parallel arm resonators and the number thereof, and the structure of connection between the inductors and the number thereof are not limited to those of the circuit structure illustrated in FIG. 2.

The filter 63 includes a circuit structure close to that of the filter 62. Specifically, the filter 63 includes series arm resonators S3 and S4 that are disposed on a path that connects input and output terminals, parallel arm resonators P4, P5, and P6 that are connected between the path and the ground, and inductors L3 and L4. The inductors L3 and L4 may be capacitors or may be composite elements of an inductor and a capacitor.

The filter 63 (A-Rx) is an example of the first filter and an example of the second filter and is connected between the low-noise amplifier 21 and the antenna connection terminal 100. Specifically, an end of the filter 63 is connected to the antenna connection terminal 100 with the matching circuit 431, the switch 51, and the matching circuit 401 interposed therebetween. Another end of the filter 63 is connected to the input end of the low-noise amplifier 21 with the matching circuit 432, the switch 53, and the matching circuit 433 interposed therebetween. The filter 63 has a pass band that includes a downlink operation band in the band A for FDD and enables a reception signal in the band A to pass.

The filter 64 (C-Tx) is connected between the power amplifier 12 and the antenna connection terminal 100. Specifically, an end of the filter 64 is connected to the antenna connection terminal 100 with the matching circuit 441, the switch 51, and the matching circuit 401 interposed therebetween. Another end of the filter 64 is connected to the output end of the power amplifier 12 with the matching circuit 442, the switch 54, and the matching circuit 443 interposed therebetween. The filter 64 has a pass band that includes an uplink operation band in the band C for FDD and enables a transmission signal in the band C to pass.

The filter 65 (D-TRx) is an example of the first filter and an example of the second filter, is connected between the antenna connection terminal 100 and the power amplifier 12, and is connected between the antenna connection terminal 100 and the low-noise amplifier 22. Specifically, an end of the filter 65 is connected to the antenna connection terminal 100 with the switch 51 and the matching circuit 401 interposed therebetween. Another end of the filter 65 is connected to the output end of the power amplifier 12 with the matching circuit 452, the switch 54, and the matching circuit 443 interposed therebetween, and is connected to the input end of the low-noise amplifier 22 with the matching circuit 452, the switches 54 and 55, and the matching circuit 463 interposed therebetween. The filter 65 has a pass band that includes the band D for TDD and enables a transmission signal and a reception signal in the band D to pass.

The filter 66 (C-Rx) is an example of the first filter and an example of the second filter and is connected between the low-noise amplifier 22 and the antenna connection terminal 100. Specifically, an end of the filter 66 is connected to the antenna connection terminal 100 with the matching circuit 461, the switch 51, and the matching circuit 401 interposed therebetween. Another end of the filter 66 is connected to the input end of the low-noise amplifier 22 with the matching circuit 462, the switch 55, and the matching circuit 463 interposed therebetween. The filter 66 has a pass band that includes a downlink operation band in the band C for FDD and enables a reception signal in the band C to pass.

The PA controller 71 can control the power amplifiers 11 and 12. The PA controller 71 receives a digital control signal from the RFIC 3 via the control terminal 131 and outputs a control signal to the power amplifiers 11 and 12.

The bands A to D are frequency bands for a communication system that is built by using radio access technology (RAT). The bands A to D are defined by, for example, standards organizations (such as 3GPP (3rd Generation Partnership Project) and IEEE (Institute of Electrical and Electronics Engineers)) in advance. Examples of the communication system include a 5GNR (5th Generation New Radio) system, a LTE (Long Term Evolution) system, and a WLAN (Wireless Local Area Network) system.

The bands A and B and the bands C and D may belong to different band groups or may belong to the same band group. A band group means a frequency range in which multiple bands are included. Examples of the band group can include an ultra-high band group (3300 to 5000 MHz), a high band group (2300 to 2690 MHz), a middle band group (1427 to 2200 MHz), and a low band group (698 to 960 MHz) but are not limited thereto. An example of the band group may be a band group that includes an unlicensed band of 5 GHz or more or a band group of a millimeter band.

For example, the bands A and B may be included in the high band group, and the bands C and D may be included in the middle band group. For example, the bands A and B may be included in the middle band group or the high band group, and the bands C and D may be included in the low band group.

The radio frequency circuit 1 is illustrated in FIG. 1 by way of example and is not limited thereto. For example, bands that are supported by the radio frequency circuit 1 are not limited to the bands A to D. For example, the radio frequency circuit 1 may support five or more bands. In this case, the radio frequency circuit 1 may include a filter for bands E, F, G, and so on. For example, the radio frequency circuit 1 may support only the bands A and B and does not necessarily need to support the bands C and D. In this case, the radio frequency circuit 1 does not necessarily need to include the power amplifier 12, the low-noise amplifier 22, the matching circuits 441 to 443, 452, and 461 to 463, the radio frequency input terminal 112, and the radio frequency output terminal 122. For example, the radio frequency circuit 1 may be a transmit-only circuit. In this case, the radio frequency circuit 1 does not necessarily need to include the low-noise amplifiers 21 and 22, the matching circuits 431 to 433 and 461 to 463, the switches 53 and 55, the filters 63 and 66, and the radio frequency output terminals 121 and 122. For example, the radio frequency circuit 1 may be a receive-only circuit. In this case, the radio frequency circuit 1 does not necessarily need to include the power amplifiers 11 and 12, the matching circuits 411 to 413 and 441 to 443, the switches 52 and 54, the filters 61 and 64, and the radio frequency input terminals 111 and 112.

The radio frequency circuit 1 does not necessarily need to include some of the matching circuits 401, 411 to 413, 422, 431 to 433, 441 to 443, 452, and 461 to 463. For example, the radio frequency circuit 1 may be connected to multiple antennas and may include multiple antenna connection terminals. The radio frequency circuit 1 may further include an additional radio frequency input terminal. In this case, a switch that can change the connection destination of a power amplifier between multiple radio frequency input terminals may be interposed between the power amplifier and the multiple radio frequency input terminals. The radio frequency circuit 1 may further include an additional radio frequency output terminal. In this case, a switch that can change the connection destination of a low-noise amplifier between multiple radio frequency output terminals may be interposed between the low-noise amplifier and the multiple radio frequency output terminals.

[2 Example of Radio Frequency Circuit 1]

A radio frequency module 1A that includes the radio frequency circuit 1 will be described as an example of the radio frequency circuit 1 according to the embodiment described above with reference to FIG. 3 to FIG. 7.

[2.1 Arrangement of Components of Radio Frequency Module 1A]

Figure 3:
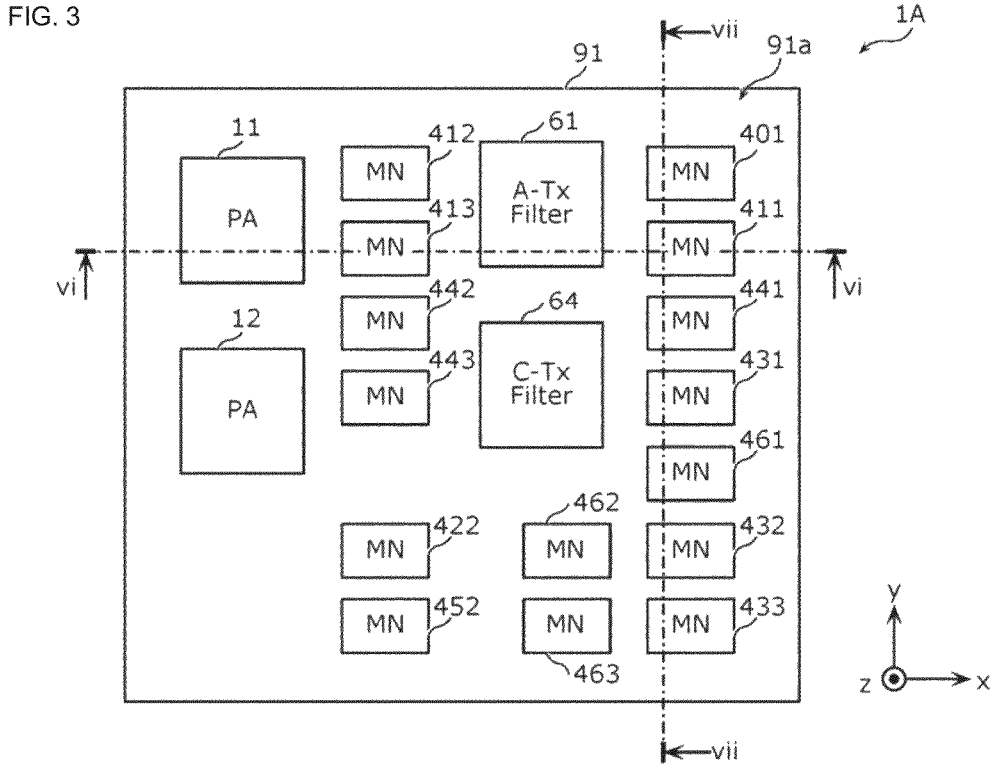
FIG. 3 is a plan view of a first main surface of a radio frequency module in an example.
Figure 4:
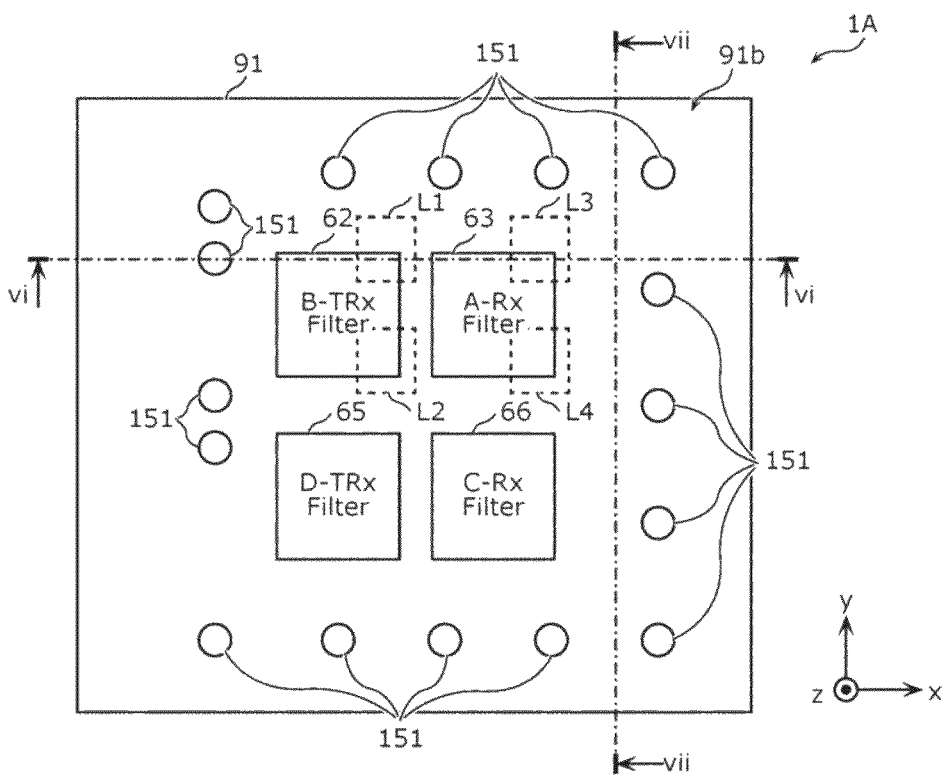
FIG. 4 is a plan view of a second main surface of the radio frequency module in the example.
Figure 5:
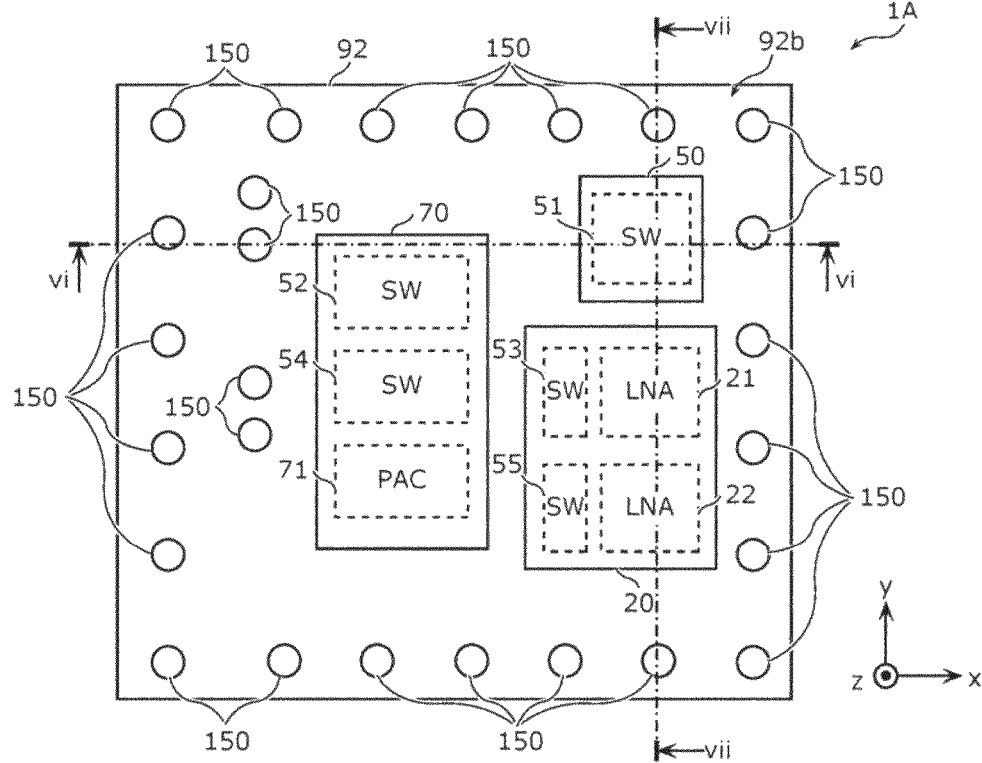
FIG. 5 is a plan view of a fourth main surface of the radio frequency module in the example.
Figure 6:
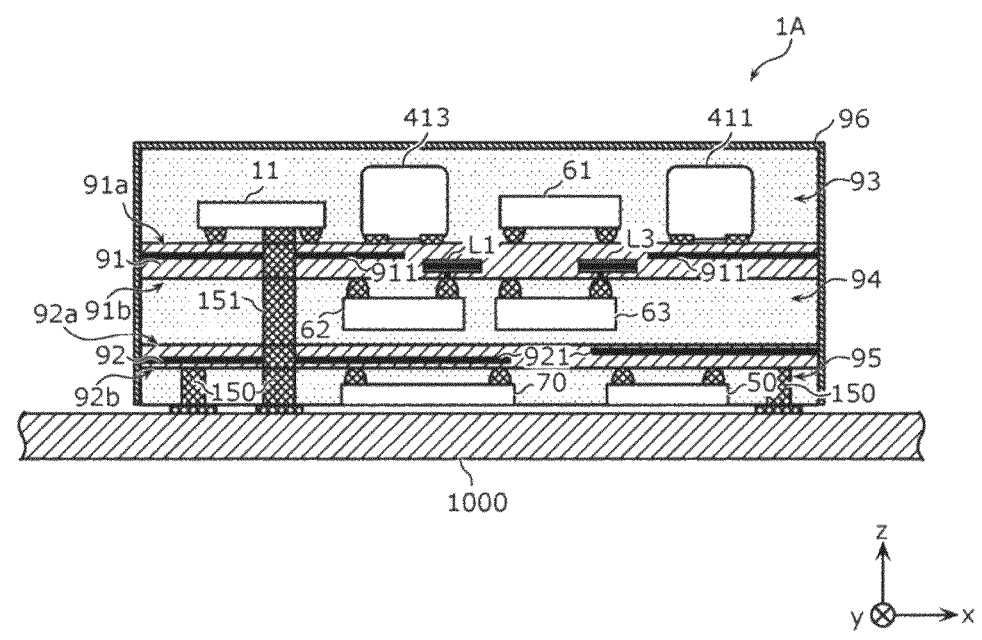
FIG. 6 is a first sectional view of the radio frequency module in the example.
Figure 7:
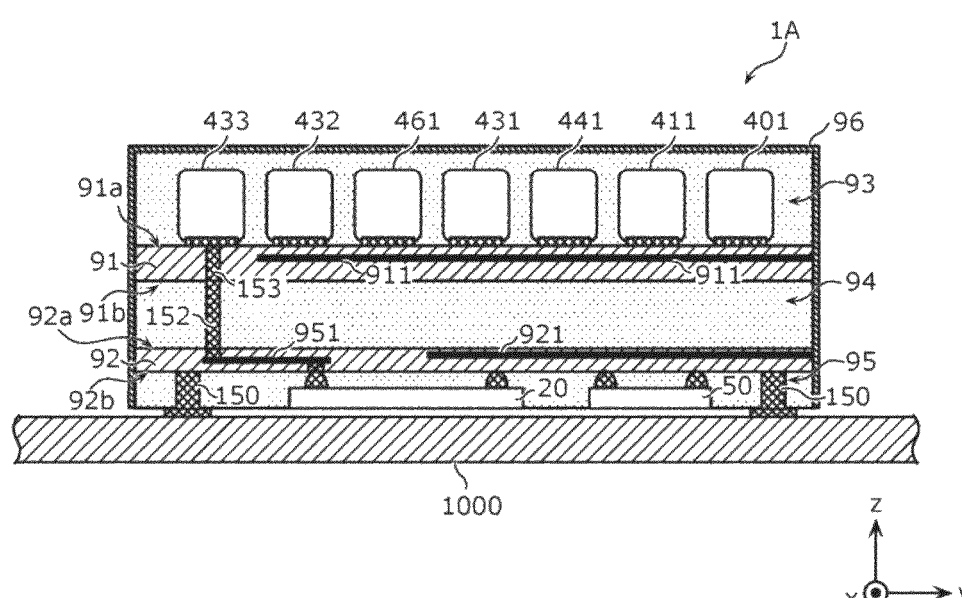
FIG. 7 is a second sectional view of the radio frequency module in the example.

FIG. 3 is a plan view of a main surface 91*a* of the radio frequency module 1A in the present example. FIG. 4 is a plan view of a main surface 91*b* of the radio frequency module 1A in the present example and illustrates the main surface 91*b* of a module substrate 91 viewed from a positive position on the z-axis. FIG. 5 is a plan view of a main surface 92*b* of the radio frequency module 1A in the present example and illustrates the main surface 92*b* of a module substrate 92 viewed in a positive position on the z-axis. FIG. 6 is a sectional view of the radio frequency module 1A in the present example. A section of the radio frequency module 1A in FIG. 6 is a section taken along line vi-vi in FIG. 3 to FIG. 5. FIG. 7 is a sectional view of the radio frequency module 1A in the present example. A section of the radio frequency module 1A in FIG. 7 is a section taken along line vii-vii in FIG. 3 to FIG. 5.

In FIG. 3 to FIG. 7, an illustration for wiring lines that connect multiple electronic components that are disposed in, on, or along the module substrates 91 and 92 is partly omitted. In FIG. 3 to FIG. 7, an illustration for resin members 93 to 95 that cover the multiple electronic components and a shield electrode layer 96 that covers surfaces of the resin members 93 to 95 is omitted.

The radio frequency module 1A includes the module substrates 91 and 92, the resin members 93 to 95, the shield electrode layer 96, multiple external connection terminals 150, and multiple inter-substrate connection terminals 151 in addition to multiple electronic components that include multiple circuit elements illustrated in FIG. 1.

The module substrate 91 is an example of a first module substrate and has the main surfaces 91*a* and 91*b* that face each other. The main surfaces 91*a* and 91*b* are examples of a first main surface and a second main surface.

The module substrate 92 is an example of a second module substrate and has a main surface 92*a* and the main surface 92*b* that face each other. The main surfaces 92*a* and 92*b* are examples of a third main surface and a fourth main surface.

The module substrates 91 and 92 are disposed such that the main surface 91*b* of the module substrate 91 faces the main surface 92*a* of the module substrate 92. The module substrates 91 and 92 are disposed so as to be separated from each other such that electronic components can be disposed between the main surfaces 91*b* and 92*a*. The multiple electronic components are disposed in, on, or along the two module substrates 91 and 92, specifically, between the main surfaces 91*b* and 92*a*, on or along the main surface 91*a*, and on or along the main surface 92*b* so as to be divided into three layers. As for the radio frequency module 1A, one or more electronic components or circuit elements can be disposed in the module substrate 91 and in the module substrate 92.

In FIG. 3 to FIG. 7, the module substrates 91 and 92 have a rectangular shape having the same size in a plan view but may have different sizes and/or different shapes. The shape of the module substrates 91 and 92 is not limited to a rectangular shape.

Examples of the module substrate 91 can include a high temperature co-fired ceramic (HTCC) substrate or a low-temperature co-fired ceramic (LTCC) substrate having a multilayer structure of multiple dielectric layers but are not limited thereto.

An example of the module substrate 92 can include a printed circuit board (PCB) but is not limited thereto.

A ground conductor 911 that extends in parallel with the main surfaces 91*a* and 91*b* may be formed in the module substrate 91. This improves isolation between an electronic component that is disposed on or along the main surface 91*a* and an electronic component that is disposed on or along the main surface 91*b*. A ground conductor 921 that extends in parallel with the main surfaces 92*a* and 92*b* may be formed in the module substrate 92. This improves isolation between an electronic component that is disposed on or along the main surface 92*a* and an electronic component that is disposed on or along the main surface 92*b*.

The multiple external connection terminals 150 are disposed on or along the main surface 92*b* (a lower layer). The multiple external connection terminals 150 include a ground terminal in addition to the antenna connection terminal 100, the radio frequency input terminals 111 and 112, the radio frequency output terminals 121 and 122, and the control terminal 131 illustrated in FIG. 1. The multiple external connection terminals 150 are joined to, for example, input and output terminals and/or a ground terminal on or along a motherboard 1000 that is disposed at a negative position on the z-axis of the radio frequency module 1A.

Examples of the multiple external connection terminals 150 can include a copper post electrode, but shapes and materials are not limited thereto. Some of the multiple external connection terminals 150 overlap the power amplifiers 11 and 12 in a plan view and function as heat dissipation electrodes of the power amplifiers 11 and 12 together with the inter-substrate connection terminals 151 that are connected to the power amplifiers 11 and 12.

The relative dielectric constant of the module substrate 91 is higher than the relative dielectric constant of the module substrate 92.

The power amplifiers 11 and 12, the matching circuits 401, 411 to 413, 422, 431 to 433, 441 to 443, 452, and 461 to 463, and the filters 61 and 64 are disposed on or along the main surface 91*a* (an upper layer). The matching circuits described above include respective chip inductors. Each chip inductor is a surface mount device (SMD) that is included in an inductor. The matching circuits described above may include respective chip capacitors in addition to the chip inductors. The arrangement of the chip capacitors is not particularly limited. The matching circuits described above may be disposed on or along the main surface 91*b* or may be disposed in the module substrate 91.

The inductors L1 and L2 of the filter 62 and the inductors L3 and L4 of the filter 63 are disposed in the module substrate 91. Each of the inductors L1 to L4 is a LC component that is disposed in the module substrate 91 and that is an inductor or a capacitor. Each of the inductors L1 to L4 includes a coil conductor in which multiple conductor patterns that are formed in parallel with the main surfaces 91*a* and 91*b* in the module substrate 91 are stacked in a direction perpendicular to the main surfaces 91*a* and 91*b*.

The inductors L1 to L4 are disposed in the module substrate 91 the relative dielectric constant of which is relatively high and accordingly, an inductance value per unit area can be increased. For this reason, the sizes of the inductors L1 to L4 can be decreased.

The series arm resonators S1 to S2 and the parallel arm resonators P1 to P3 of the filter 62 and the series arm resonators S3 to S4 and the parallel arm resonators P4 to P6 of the filter 63 are disposed on or along the main surface 91*a* or the main surface 91*b*.

For example, the power amplifiers 11 and 12 are composed of a CMOS (Complementary Metal Oxide Semiconductor) and may be specifically manufactured in a SOI (Silicon on Insulator) process. This enables the power amplifiers 11 and 12 to be manufactured at low costs. The power amplifiers 11 and 12 may be composed of at least gallium arsenide (GaAs), silicon germanium (SiGe), or gallium nitride (GaN). This enables the power amplifiers 11 and 12 to have high quality. A semiconductor material for the power amplifiers 11 and 12 is not limited to the materials described above.

Examples of the filters 61 and 64 may include a surface acoustic wave (SAW) filter, a bulk acoustic wave (BAW) filter, a LC resonance filter, and a dielectric filter but are not limited thereto.

The resin member 93 covers the main surface 91*a* and electronic components on or along the main surface 91*a*. The resin member 93 has a function of ensuring the reliability of, for example, the mechanical strength and humidity resistance of the electronic components on or along the main surface 91*a*. The radio frequency module 1A does not necessarily need to include the resin member 93.

The filter 62 (a part thereof), the filter 63 (a part thereof), the filters 65 and 66, and the multiple inter-substrate connection terminals 151 are disposed between the main surfaces 91*b* and 92*a* (an intermediate layer). The resin member 94 is injected between the main surfaces 91*b* and 92*a* and covers the electronic components that are disposed between the main surfaces 91*b* and 92*a*.

The filter 62 is an example of the first filter and an example of the second filter. The filter 63 is an example of the first filter and an example of the second filter. Examples of the filters 62 and 63 may include a SAW filter, a BAW filter, a LC resonance filter, and a dielectric filter but are not limited thereto.

The filters 65 and 66 are examples of the first filter, and examples thereof may include a SAW filter, a BAW filter, a LC resonance filter, and a dielectric filter but are not limited thereto.

The multiple electronic components (here, the filters 62, 63, 65, and 66) that are disposed between the main surfaces 91*b* and 92*a* are electrically connected to the module substrate 91 with electrodes that face the module substrate 91 interposed therebetween. The multiple electronic components (here, the filters 62, 63, 65, and 66) that are disposed between the main surfaces 91*b* and 92*a* may be electrically connected to the module substrate 92 with electrodes that face the module substrate 92 interposed therebetween.

The multiple inter-substrate connection terminals 151 are electrodes for electrically connecting the module substrates 91 and 92. Some of the inter-substrate connection terminals 151 overlap the power amplifiers 11 and 12 in a plan view, are connected to the external connection terminals 150, and function as the heat dissipation electrodes of the power amplifiers 11 and 12. Examples of the inter-substrate connection terminals 151 include a copper post electrode, but shapes and materials are not limited thereto.

The resin member 94 covers the main surfaces 91*b* and 92*a* and the electronic components between the main surfaces 91*b* and 92*a*. The resin member 94 has a function of ensuring the reliability of, for example, the mechanical strength and humidity resistance of the electronic components between the main surfaces 91*b* and 92*a*. The radio frequency module 1A does not necessarily need to include the resin member 94.

Integrated circuits 20 and 70 and the switch 51 are disposed on or along the main surface 92*b* (the lower layer) in addition to the multiple external connection terminals 150.

The integrated circuit 20 includes the low-noise amplifiers 21 and 22 and the switches 53 and 55. Circuit elements that are included in the low-noise amplifiers 21 and 22 and the switches 53 and 55 are formed on or along a circuit surface of the integrated circuit 20. An example of the circuit surface is a main surface of the integrated circuit 20 that faces the module substrate 92. The integrated circuit 70 includes the switches 52 and 54 and the PA controller 71. Circuit elements that are included in the switches 52 and 54 and the PA controller 71 are formed on or along a circuit surface of the integrated circuit 70. An example of the circuit surface is a main surface of the integrated circuit 70 that faces the module substrate 92. An integrated circuit 50 includes the switch 51. The switch 51 may be included in the integrated circuit 20 or 70.

For example, the integrated circuits 20, 50, and 70 are composed of a CMOS and may be specifically manufactured in a SOI process. The integrated circuits 20, 50, and 70 may be composed of at least GaAs, SiGe, or GaN. A semiconductor material for the integrated circuits 20, 50, and 70 is not limited to the materials described above.

The low-noise amplifiers 21 and 22 may be disposed on or along the main surface 92*a*.

At least a part of a wiring line that connects the filter 62 and the low-noise amplifier 21 to each other, at least a part of a wiring line that connects the filter 63 and the low-noise amplifier 21 to each other, at least a part of a wiring line that connects the filter 65 and the low-noise amplifier 22 to each other, and at least a part of a wiring line that connects the filter 66 and the low-noise amplifier 22 to each other are formed in, on, or along the module substrate 92.

At least the parts of the wiring lines described above are disposed in the module substrate 92 the relative dielectric constant of which is relatively low, and accordingly, stray capacitance parasitic on the entrances of the low-noise amplifiers 21 and 22 can be reduced. For this reason, the noise figures of the low-noise amplifiers 21 and 22 can be reduced.

As illustrated in FIG. 7, the matching circuit 433 and the low-noise amplifier 21 that is contained in the integrated circuit 20 are connected to each other with a via conductor 153, an inter-substrate connection terminal 152, and a conductor wiring line 951 interposed therebetween.

The via conductor 153 is a conductor wiring line that is formed in the module substrate 91 in a direction perpendicular to the main surface 91*b*. The inter-substrate connection terminal 152 is a conductor wiring line that is formed between the main surface 91*b* and the main surface 92*a* in a direction perpendicular to the main surface 91*b* and the main surface 92*a*. The conductor wiring line 951 is a conductor wiring line that is formed in, on, or along the module substrate 92 in a direction parallel with the main surface 92*a*.

The conductor wiring line 951 that is connected to the low-noise amplifier 21 is disposed in the module substrate 92 the relative dielectric constant is relatively low, and accordingly, the stray capacitance parasitic on the entrance of the low-noise amplifier 21 can be reduced. For this reason, the noise figure of the low-noise amplifier 21 can be reduced.

Among the wiring lines (the via conductor 153, the inter-substrate connection terminal 152, and the conductor wiring line 951) for the matching circuit 433 and the low-noise amplifier 21, the conductor wiring line 951 that is formed in, on, or along the module substrate 92 is longer than the via conductor 153 that is formed in, on, or along the module substrate 91. This enables the stray capacitance parasitic on the entrance of the low-noise amplifier 21 to be effectively reduced. For this reason, the noise figure of the low-noise amplifier 21 can be further reduced.

A circuit element that is included in the switch 51 is formed on or along a circuit surface of a switch device. An example of the circuit surface is a main surface of the switch device that faces the module substrate 92. For example, the switch 51 is composed of a CMOS and may be specifically manufactured in a SOI process. The switch 51 may be composed of at least GaAs, SiGe, or GaN. A semiconductor material for the switch 51 is not limited to the materials described above. The integrated circuit 20 may include the switch 51.

A first electronic component (here, the integrated circuits 20 and 70 and the switch 51) that includes at least a transistor is disposed on or along the main surface 92b as described above, and a second electronic component (here, the filters 61 to 66 and the matching circuits 401, 411 to 413, 422, 431 to 433, 441 to 443, 452, and 461 to 463) that includes no transistor is not disposed on or along the main surface 92b. That is, among the multiple electronic components, only the first electronic component is disposed on or along the main surface 92b. This enables the lower surface of the radio frequency module 1A to be cut and enables the thicknesses of the resin member 95, the integrated circuits 20 and 70, and the switch 51 to be reduced.

The resin member 95 covers the main surface 92b and the electronic components on or along the main surface 92b. The resin member 95 has a function of ensuring the reliability of, for example, the mechanical strength and humidity resistance of the electronic components on or along the main surface 92b. The radio frequency module 1A does not necessarily need to include the resin member 95.

The shield electrode layer 96 is a metal thin film that is formed by, for example, a spattering method and covers the upper surface of the resin member 93, the side surfaces of the resin members 93 to 95 and the module substrates 91 and 92. The shield electrode layer 96 is connected to the ground and inhibits an extraneous noise from being transmitted to the electronic components that are included in the radio frequency module 1A. The radio frequency module 1A does not necessarily need to include the shield electrode layer 96.

As for the radio frequency module 1A in the present example, the module substrate 91 the relative dielectric constant of which is high is farther than the module substrate 92 the relative dielectric constant of which is low to the motherboard 1000. However, the module substrate 91 the relative dielectric constant of which is high may be nearer than the module substrate 92 the relative dielectric constant of which is low to the motherboard 1000. For example, the module substrate 91 that is a ceramic substrate may be nearer than the module substrate 92 that is a printed circuit board to the motherboard 1000.

[2.2 Effects of Radio Frequency Module 1A]

The radio frequency module 1A in the present example includes the module substrate 91 that has the main surfaces 91a and 91b that face each other, the module substrate 92 that has the main surfaces 92a and 92b that face each other, the main surface 92a facing the main surface 91b, the multiple electronic components that are disposed between the main surfaces 91b and 92a, on or along the main surface 91a, and on or along the main surface 92b, and the LC component that is disposed in the module substrate 91 and that is an inductor or a capacitor, and the relative dielectric constant of the module substrate 91 is higher than the relative dielectric constant of the module substrate 92 as described above.

In this case, the LC component is disposed in the module substrate 91 the relative dielectric constant is relatively high, and accordingly, the inductance value or the capacitance value per unit area can be increased. For this reason, the size of the LC component can be decreased while the inductance value or the capacitance value is ensured, and accordingly, the size of the radio frequency module 1A can be decreased while the good transmission characteristics of the radio frequency module 1A are ensured.

The radio frequency module 1A in the present example includes the module substrate 91 that has the main surfaces 91a and 91b that face each other, the module substrate 92 that has the main surfaces 92a and 92b that face each other, the main surface 92a facing the main surface 91b, the multiple electronic components that are disposed between the main surfaces 91b and 92a, on or along the main surface 91a, and on or along the main surface 92b, and the LC component that is disposed in the module substrate 91 and that is an inductor or a capacitor, the module substrate 92 is a printed circuit board, and the module substrate 91 is a low-temperature co-fired ceramic substrate or a high-temperature co-fired ceramic substrate.

In this case, the relative dielectric constant of the module substrate 91 is higher than the relative dielectric constant of the module substrate 92, and accordingly, the LC component that is disposed in the module substrate 91 can increase the inductance value or the capacitance value per unit area. For this reason, the size of the LC component can be decreased while the inductance value or the capacitance value is ensured, and accordingly, the size of the radio frequency module 1A can be decreased while the good transmission characteristics of the radio frequency module 1A are ensured.

For example, as for the radio frequency module 1A in the present example, the multiple electronic components include the first filter and the low-noise amplifiers 21 and 22 or the low-noise amplifier 21 or 22 disposed on or along the main surface 92a or the main surface 92b, and at least a part of the wiring line that connects the first filter and the low-noise amplifiers 21 and 22 or the low-noise amplifier 21 or 22 to each other is formed in, on, or along the module substrate 92.

In this case, at least a part of the wiring line described above is disposed in the module substrate 92 the relative dielectric constant of which is relatively low, and accordingly, the stray capacitance parasitic on the entrances of the low-noise amplifiers 21 and 22 or the entrance of the low-noise amplifier 21 or 22 can be reduced. For this reason, the noise figures of the low-noise amplifiers 21 and 22 or the noise figure of the low-noise amplifier 21 or 22 can be reduced.

For example, as for the radio frequency module 1A in the present example, the multiple electronic components further include the first inductor that is connected between the low-noise amplifier 21 and the first filter and between the low-noise amplifier 22 and the first filter, or between the low-noise amplifier 21 or 22 and the first filter and that is disposed on or along the main surface 91a or the main surface 91b, and the wiring line that is formed in, on, or along the module substrate 92 and that is included in the wiring lines that connect the first inductor and the low-noise amplifier 21 to each other and the first inductor and the low-noise amplifier 22 to each other, or in the wiring line that connects the first inductor and the low-noise amplifier 21 or 22 to each other may be longer than the wiring line that is formed in, on, or along the module substrate 91.

This enables the stray capacitance parasitic on the entrances of the low-noise amplifiers 21 and 22 or the entrance of the low-noise amplifier 21 or 22 to be effectively reduced. For this reason, the noise figures of the low-noise amplifiers 21 and 22 or the noise figure of the low-noise amplifier 21 or 22 can be further reduced.

For example, as for the radio frequency module 1A in the present example, the multiple electronic components include the second filter (the filter 62), and the second filter includes the series arm resonators S1 to S2 that are disposed on the path that connects the input terminal and the output terminal to each other and the parallel arm resonators P1 to P3 that are connected between the path and the ground, the series arm resonators S1 to S2 and the parallel arm resonators P1 to P3 are disposed on or along the main surface 91*a* or the main surface 91*b*, and the LC component (the inductors L1 and L2) described above is connected between the parallel arm resonators and the ground.

The LC component (the inductors L1 and L2) for expanding the pass band of the second filter and improving the attenuation characteristics does not need a high Q value but needs a large inductance value or a large capacitance value. For this purpose, the LC component described above is disposed in the module substrate 91 the dielectric constant of which is relatively high, and accordingly, the inductance value or the capacitance value can be increased. For this reason, the good transmission characteristics of the second filter can be ensured.

For example, the radio frequency module 1A in the present example may further include the multiple external connection terminals 150 that are disposed on or along the main surface 92*b*.

The communication device 5 in the present example includes the RFIC 3 that processes a radio frequency signal and the radio frequency module 1A that transmits the radio frequency signal between the RFIC 3 and the antenna 2.

This enables the communication device 5 to exert the effects of the radio frequency module 1A described above.

Modification

The radio frequency module and the communication device according to the present disclosure are described above based on the embodiment and the example. The radio frequency module and the communication device according to the present disclosure are not limited to the embodiment and the example described above. The present disclosure includes another example in which freely selected components in the example described above are combined, modifications that are acquired by modifying the embodiment described above and the example described above in various ways by a person skilled in the art without departing from the spirit of the present disclosure, and various devices that contain the radio frequency module described above.

For example, in the circuit structures of the radio frequency circuit and the communication device according to the embodiment described above, another circuit element and another wiring line may be interposed between paths that connect signal paths and the circuit elements illustrated in the figures. For example, a matching circuit may be interposed between the switch 51 and the filter 62, and/or between the switch 51 and the filter 65.

The arrangement of the multiple electronic components in the above examples is described above by way of example and is not limited to the above examples. For example, the position of a freely selected electronic component in a freely selected one of the examples may be replaced with the position of the electronic component in another example. For example, in the examples, the integrated circuit 70 that includes the PA controller 71 may be stacked on the power amplifiers 11 and 12 or the power amplifier 11 or 12. For example, as for the radio frequency module 1A in the example, the power amplifiers 11 and 12 may be disposed between the main surfaces 91*b* and 92*a*.

In the examples, the multiple external connection terminals 150 are copper post electrodes but are not limited thereto. For example, the multiple external connection terminals 150 may be bump electrodes. In this case, the radio frequency module does not necessarily need to include the resin member 95.

INDUSTRIAL APPLICABILITY

The present disclosure can be widely used as a radio frequency module that is disposed at a front end portion for a communication device such as a cellular phone.

The invention claimed is:

1. A radio frequency module comprising:
a first module substrate that has a first main surface facing a second main surface;
a second module substrate that has a third main surface facing a fourth main surface, the third main surface facing the second main surface;
multiple electronic components that are disposed between the second main surface and the third main surface, on or along the first main surface, and on or along the fourth main surface; and
a LC component that is disposed in the first module substrate and that is an inductor or a capacitor,
wherein a relative dielectric constant of the first module substrate is higher than a relative dielectric constant of the second module substrate.

2. The radio frequency module according to claim 1,
wherein the multiple electronic components include
a first filter, and
a low-noise amplifier that is disposed on or along the third main surface or the fourth main surface, and
wherein at least a part of a wiring line that connects the first filter and the low-noise amplifier is formed in, on, or along the second module substrate.

3. The radio frequency module according to claim 2,
wherein the multiple electronic components further include a first inductor that is connected between the low-noise amplifier and the first filter and that is disposed on or along the first main surface or the second main surface, and
wherein a wiring line that is formed in, on, or along the second module substrate and that is included in the wiring line that connects the first inductor and the low-noise amplifier is longer than a wiring line that is formed in, on, or along the first module substrate.

4. The radio frequency module according to claim 2,
wherein the multiple electronic components further include a first inductor that is connected between the low-noise amplifier and the first filter and that is disposed on or along the first main surface or the second main surface, and
wherein a wiring line that is formed in, on, or along the second module substrate and that is included in the wiring line that connects the first inductor and the low-noise amplifier is longer than a wiring line that is formed in, on, or along the first module substrate.

5. The radio frequency module according to claim 1,
wherein the multiple electronic components include a second filter,
wherein the second filter includes a series arm resonator that is disposed on a path that connects an input terminal and an output terminal, and a parallel arm resonator that is connected between the path and a ground, wherein the series arm resonator and the parallel arm resonator are disposed on or along the first main surface or the second main surface, and wherein the LC component is connected between the parallel arm resonator and the ground.

6. The radio frequency module according to claim 1, further comprising:

multiple external connection terminals that are disposed on or along the fourth main surface.

7. A radio frequency module comprising:

a first module substrate that has a first main surface facing a second main surface;

a second module substrate that has a third main surface facing a fourth main surface, the third main surface facing the second main surface;

multiple electronic components that are disposed between the second main surface and the third main surface, on or along the first main surface, and on or along the fourth main surface; and a LC component that is disposed in the first module substrate and that is an inductor or a capacitor, wherein the second module substrate is a printed circuit board, and wherein the first module substrate is a low-temperature co-fired ceramic substrate or a high-temperature co-fired ceramic substrate.

8. The radio frequency module according to claim 7, wherein the multiple electronic components include a first filter, and a low-noise amplifier that is disposed on or along the third main surface or the fourth main surface, and wherein at least a part of a wiring line that connects the first filter and the low-noise amplifier is formed in, on, or along the second module substrate.

9. The radio frequency module according to claim 7, wherein the multiple electronic components include a second filter, wherein the second filter includes a series arm resonator that is disposed on a path that connects an input terminal and an output terminal, and a parallel arm resonator that is connected between the path and a ground, wherein the series arm resonator and the parallel arm resonator are disposed on or along the first main surface or the second main surface, and wherein the LC component is connected between the parallel arm resonator and the ground.

10. The radio frequency module according to claim 7, further comprising:

multiple external connection terminals that are disposed on or along the fourth main surface.

11. A communication device comprising:

a signal processing circuit that processes a radio frequency signal; and a radio frequency module that transmits the radio frequency signal between the signal processing circuit and an antenna, the radio frequency module including a first module substrate that has a first main surface facing a second main surface;

a second module substrate that has a third main surface facing a fourth main surface, the third main surface facing the second main surface;

multiple electronic components that are disposed between the second main surface and the third main surface, on or along the first main surface, and on or along the fourth main surface; and a LC component that is disposed in the first module substrate and that is an inductor or a capacitor, wherein a relative dielectric constant of the first module substrate is higher than a relative dielectric constant of the second module substrate.

12. The communication device of claim 11, wherein the multiple electronic components include a first filter, and a low-noise amplifier that is disposed on or along the third main surface or the fourth main surface, and wherein at least a part of a wiring line that connects the first filter and the low-noise amplifier is formed in, on, or along the second module substrate.

13. The communication device of claim 12, wherein the multiple electronic components further include a first inductor that is connected between the low-noise amplifier and the first filter and that is disposed on or along the first main surface or the second main surface, and wherein a wiring line that is formed in, on, or along the second module substrate and that is included in the wiring line that connects the first inductor and the low-noise amplifier is longer than a wiring line that is formed in, on, or along the first module substrate.

14. The communication device of claim 11, wherein the multiple electronic components include a second filter, wherein the second filter includes a series arm resonator that is disposed on a path that connects an input terminal and an output terminal, and a parallel arm resonator that is connected between the path and a ground, wherein the series arm resonator and the parallel arm resonator are disposed on or along the first main surface or the second main surface, and wherein the LC component is connected between the parallel arm resonator and the ground.

15. The communication device of claim 11, further comprising:

multiple external connection terminals that are disposed on or along the fourth main surface.

* * * * *